(12) United States Patent
Oggier et al.

(10) Patent No.: US 7,560,701 B2
(45) Date of Patent: Jul. 14, 2009

(54) HIGHLY SENSITIVE, FAST PIXEL FOR USE IN AN IMAGE SENSOR

(75) Inventors: Thierry Oggier, Zurich (CH); Michael Lehmann, Winterthur (CH); Bernhard Buttgen, Adliswil (CH)

(73) Assignee: MESA Imaging AG, Zurich (CH)

( * ) Notice: Subject to any disclaimer, the term of this patent is extended or adjusted under 35 U.S.C. 154(b) by 21 days.

(21) Appl. No.: 11/503,524

(22) Filed: Aug. 11, 2006

(65) Prior Publication Data

US 2007/0034779 A1   Feb. 15, 2007

(30) Foreign Application Priority Data

Aug. 12, 2005   (EP) .................. 05405476

(51) Int. Cl.
*H01L 27/146* (2006.01)
(52) U.S. Cl. ................................. 250/370.09
(58) Field of Classification Search .............. 250/208.1, 250/370.09
See application file for complete search history.

(56) References Cited

U.S. PATENT DOCUMENTS

| | | | |
|---|---|---|---|
| 4,602,289 A | * | 7/1986 | Sekine ....................... 348/315 |
| 5,148,013 A | * | 9/1992 | Yamada .................... 250/208.1 |
| 6,777,659 B1 | | 8/2004 | Schwarte |
| 2002/0097331 A1 | | 7/2002 | Yamada et al. |
| 2006/0108611 A1 | * | 5/2006 | Seitz ........................ 257/222 |

FOREIGN PATENT DOCUMENTS

| | | |
|---|---|---|
| DE | 44 40 613 | 7/1996 |
| DE | 198 21 974 | 11/1999 |
| EP | 1 152 261 | 11/2001 |
| EP | 1 752 748 A1 | 2/2007 |
| GB | 2 389 960 | 12/2003 |

* cited by examiner

*Primary Examiner*—David P Porta
*Assistant Examiner*—Marcus H Taningco
(74) *Attorney, Agent, or Firm*—Houston Eliseeva LLP

(57) ABSTRACT

The pixel (1) for use in an image sensor comprises a plurality of small-sized radiation-sensitive elements (2.1-2.9) for converting incident radiation into electric signals, the radiation-sensitive elements (2.1-2.9) being properly interconnected to form a larger radiation-sensitive area. The pixel (1) further comprises a plurality of storage elements (3A-3D) for storing the electric signals. The pixel further comprises transfer means for transferring the electric signals from the radiation-sensitive elements (2.1-2.9) to any selected one of the storage elements (3A-3D). The pixel (1) exhibits a high optical sensitivity and a high demodulation speed, and is especially suited for distance-measuring sensors based on the time-of-flight (TOF) principle or interferometry.

3 Claims, 5 Drawing Sheets

HIGHLY SENSITIVE, FAST PIXEL FOR USE IN AN IMAGE SENSOR

This application claims priorty to European application No. 05 405 476.2 filed Aug. 12, 2005.

FIELD OF THE INVENTION

The present invention relates to solid-state photosensing and imaging, and especially to all solid-state photosensing applications demanding highly sensitive pixels coupled with extremely fast on-pixel samplings. These pixel characteristics are desired for spatially resolved photodetection and demodulation of temporally intensity-modulated electromagnetic waves. Such pixels are particularly interesting for non-contact distance-measuring sensors based on the time-of-flight (TOF) principle or interferometry, but as well for phase-measuring bio(chemical) applications such as fluorescence applications. The invention relates to all the sensing techniques that require one- or two-dimensional arrays of demodulation pixels.

BACKGROUND OF THE INVENTION

DE-44'40'613 C1 (Th. Sprig, P. Seitz; "Vorrichtung und Verfahren zur Detektion und Demodulation eines intensitätsmodulierten Strahlungsfeldes") teaches an image sensor with multiple sensor elements. Each sensor element (pixel) contains one photo-sensitive site. Each sensor element further contains a plurality of storage sites. The image sensor demodulates the incident electromagnetic wave into the different storage sites and thus allows the reconstruction of the incident wave. The invention allows the acquisition of an object distance. A preferred embodiment of this method relies on charge-coupled devices (CCD), as described by A. J. P. Theuwissen in "Solid-State imaging with charge coupled devices", Kluwer, Dordrecht, 1995. The disadvantage of the use of this pixel architecture having only one photo-sensitive site and a plurality of storage sites can be found in the bad trade-off that was made between optical sensitivity and sampling/demodulation speed.

DE-198'21'974 A1 (R. Schwarte; "Vorrichtung und Verfahren zur Erfassung von Phase und Amplitude elektromagnetischer Wellen") teaches the architecture of comb-like striped arrangements of the photo-gates and of the accumulation gates. The invention overcomes the speed limitations by using short paths that the photo-generated charge carriers have to travel for arriving at the storage site. The disadvantage of the invention can be found in the fact that each photo-sensitive site delivers only two samples and not at least three, as required at least to determine offset, amplitude and phase of the incident wave, or four samples at the time, as most phase measuring devices do. The invention mainly relates on DE-44'40'613 C1.

EP-1'152'261 A1 (R. Lange, P. Seitz; "Device and Method for Spatially Resolved Photodetection and Demodulation of Modulated Electromagnetic Waves") describes a method that employs pixels with two physically separated photo-sensitive areas, each of them delivering two samples. The equal distribution of the incoming electro-magnetic waves is ensured by the use of additional micro-optical elements on top. The method allows performing four samples per period simultaneously on each pixel. It yields high-speed sampling rates and still reaches a reasonable sensitivity (fill factor >10%). The drawback of the method is the use of micro-optical elements on images sensor.

GB-2'389'960 A (P. Seitz; "Four-tap demodulation pixel") describes a new technology for improving the transfer speed of the photo-generated charge carriers to the storage sites. The goal of the invention relies on delivering more constant, lateral electrical fields in the photo-sensitive area. The invention decreases the speed problem, but it is still desirable to have short transfer paths along the photo-generation site to the storage location. The requirement of short transfer paths again limits the possible photo-sensitive size within each pixel and thus limits the sensitivity, namely the fill factor of the pixel.

So far, without using micro-optical elements, there is no device architecture known in the domain of phase/distance measuring full-field imagers that exhibits very high-speed demodulation operation, i.e., short charge carrier transfer paths from the photo-generation site to the storage site, and at the same time high optical sensitivity, i.e., large photo-sensitive sites.

SUMMARY OF THE INVENTION

It is therefore an object of this invention to provide a pixel, an image sensor and a method for sensing incident radiation that are highly sensitive and simultaneously fast.

This and other objects are solved by the pixel, the image sensor and the method defined in the independent claims. Preferred embodiments of the invention are given in the dependent claims.

The inventive pixel structure represents an enhancement of all existing pixels requiring (a) extremely fast transfer times of the photo-generated charge carrier to the storage site and (b) high optical sensitivity of the pixel, i.e., large optical fill factor. The new pixel architecture is characterized by a high fill-factor, a high optical sensitivity and supporting high modulation frequencies at the same time. The basic idea is the smart geometrical combination of a plurality of radiation-sensitive elements, and a plurality of storages elements, together with means for transferring electric signals from the radiation-sensitive elements into a selected storage element.

The invention relates to all kinds of high-speed opto-electronic demodulation technologies. The main purpose behind the invention is to obtain a pixel that reaches high modulation frequencies and at the same time exhibits high optical fill factors.

In order to achieve a higher optical sensitivity without using micro-lenses, upsizing the radiation-sensitive area of the pixel provides better optical sensitivity of the pixel, but the photo-generated charge-carrier transfer paths are too long and thus the demodulation ability of the sensor gets lost already at rather small demodulation frequencies. On the other hand, downsizing the radiation-sensitive area within the pixel results in high-speed demodulation properties, but the optical sensitivity becomes poor. The invention overcomes this dilemma by exhibiting a plurality of small-sized radiation-sensitive areas which are properly interconnected to form a larger total radiation-sensitive pixel area. The small dimensions of the individual radiation-sensitive areas ensure a fast charge transfer to the storage sites and at the same time, the plurality of these radiation-sensitive areas renders the pixel optically highly sensitive. Each of the small-sized radiation-sensitive areas within the same pixel is connected with transfer means that directly connect the radiation-sensitive area with the storage site. Thus, the different small-sized photosensitive areas within each pixel share the storages sites of the pixel. Each of the small-sized photo-sensitive areas can be connected to the different storage sites within the pixel.

The transfer means are generally controlled from the outside of the pixel and are similar for all pixels.

Thus, the pixel according to the invention comprises a plurality of radiation-sensitive elements for converting incident radiation into electric signals, and a plurality of storage elements for storing the electric signals. The pixel further comprises transfer means for transferring the electric signals from the radiation-sensitive elements to any selected one of the storage elements.

The image sensor according to the invention comprises a plurality of pixels according to the invention, arranged in a one- or two-dimensional array.

The inventive method for sensing incident radiation comprises the steps of: providing a plurality of radiation-sensitive elements for converting the incident radiation into electric signals, and providing a plurality of storage elements for storing the electric signals. The incident radiation is converted into electric signals simultaneously in the plurality of radiation-sensitive elements, one of the storage elements is selected, and the electric signals from the radiation-sensitive elements are transferred into the selected storage element and summed up in said selected storage element.

The inventive method for sensing incident radiation modulated with a modulation frequency comprises the steps of: providing a plurality of radiation-sensitive elements for converting the incident radiation into electric signals, providing a plurality of storage elements for storing the electric signals, and periodically storing an electric signal generated by the incident radiation in one of the storage elements, synchronously with the modulation frequency of the incident radiation. The incident radiation is converted into electric signals simultaneously in the plurality of radiation-sensitive elements, one of the storage elements is selected, and the electric signals from the radiation-sensitive elements are transferred into the selected storage element and summed up in said selected storage element.

The electric signals accumulated in the storage elements can be detected, and demodulation parameters can be calculated from the detected electric signals. Appropriate algorithms are known from the prior art, e.g., from EP-1'152'261.

The present invention preferably makes use of semi-conducting material such as silicon for the conversion of incident photons into electron-hole pairs.

BRIEF DESCRIPTION OF THE DRAWINGS

Embodiments of the invention and, for comparison, of the prior art are described in greater detail hereinafter relative to the attached schematic drawings.

DESCRIPTION OF PREFERRED EMBODIMENTS

Figure 1:
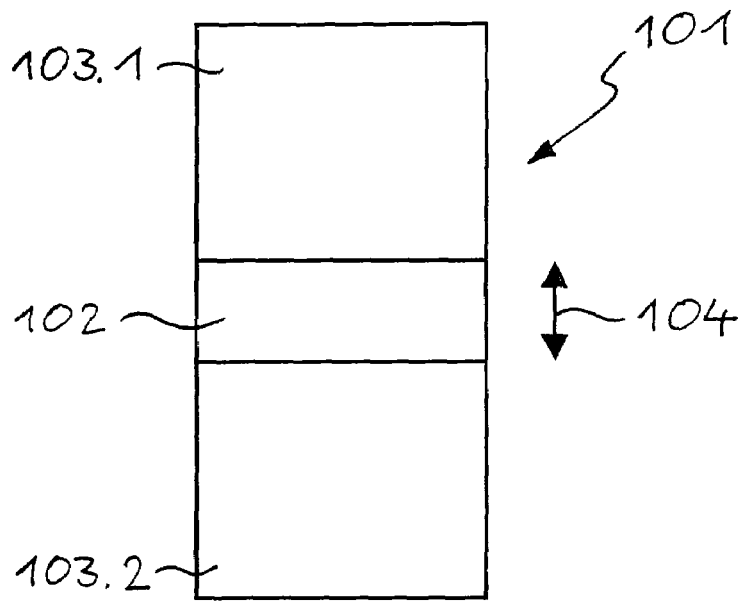
FIG. 1 illustrates a prior-art demodulation pixel that allows to control drifting only in two directions.

FIG. 1 represents a pixel 101 according to the prior art with one stripe-shaped photo-sensitive area 102 and two sampling storage sites 103.1, 103.2. This pixel 101 allows fast transfer of photo-generated charge carriers along one direction only; the transfer direction is designated with a double arrow 104. With such architectures, at most two samplings can be performed synchronously in one single modulation period.

Figure 2:
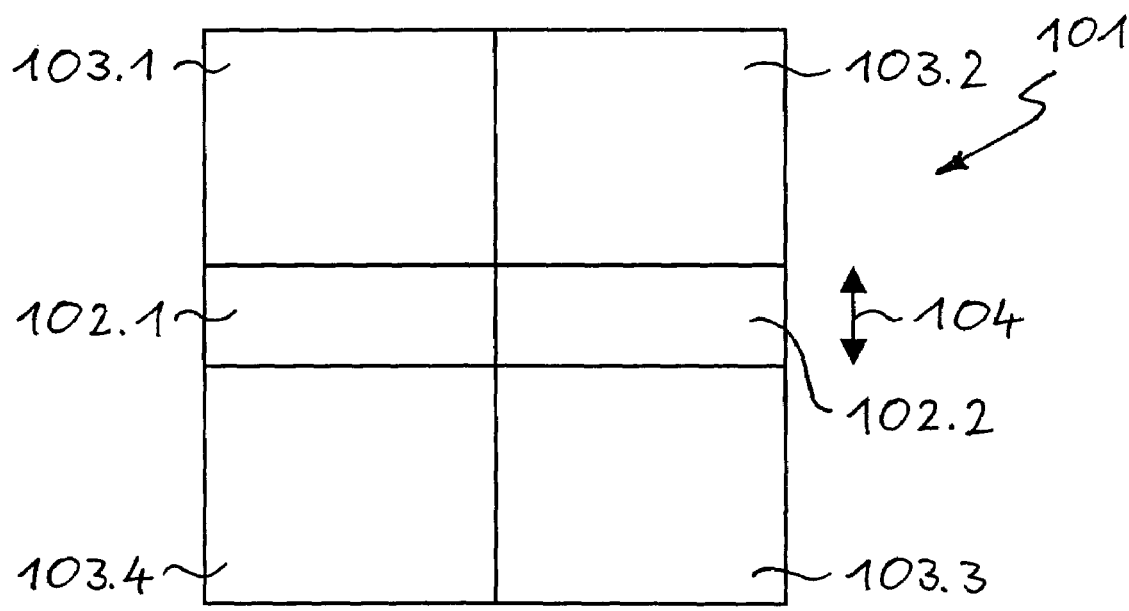
FIG. 2 shows a pixel according to EP-1'152'261 A1 with two physically separated photo-sensitive areas.

FIG. 2 shows another prior-art pixel 101 that possibly allows four synchronous samplings within one modulation period. It has two geometrically separated photo-sensitive areas 102.1, 102.2 and four sampling storage sites 103.1-103.4. The geometrical separation of the two photo-sensitive areas 102.1, 102.2 requires additional micro-optical elements (not shown) in order to uniformly distribute an incident light wave, such as described in EP-1'152'261 A1.

Figure 3A:
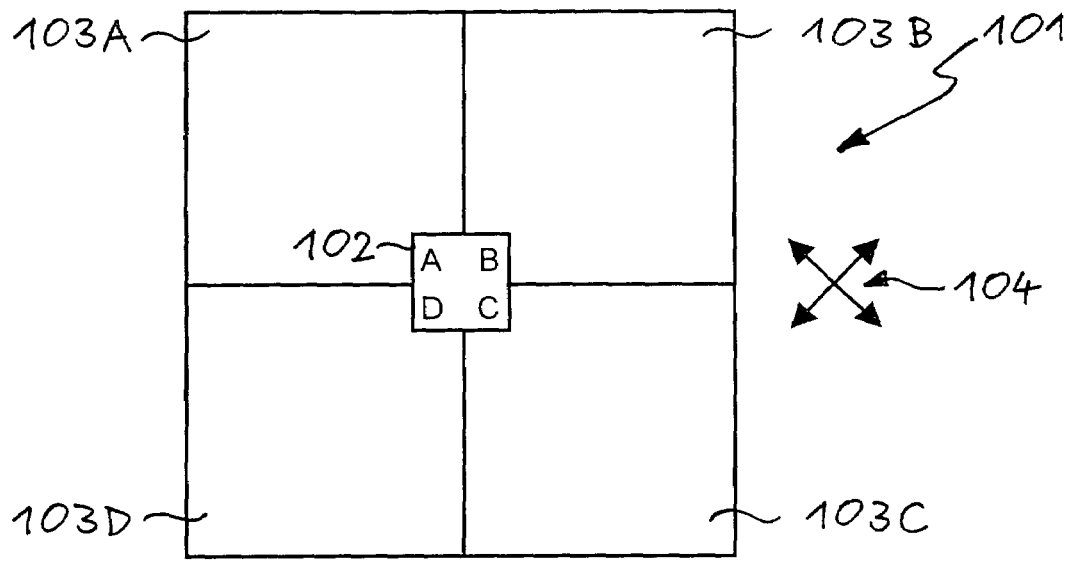
FIG. 3 shows (a) a prior-art pixel architecture containing only one photo-sensitive site but four sampling and storage sites, and (b) the photo-sensitive site of the pixel.
Figure 3B:
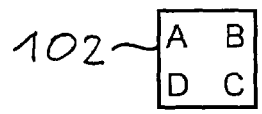

The drawback of the physically separated photo-sensitive areas 102.1, 102.2 can be overcome implementing a single small-sized photo-sensitive area 102 that allows the controlled photo-generated charge carrier drift in four directions (vertical and horizontal). FIG. 3 shows a prior-art pixel architecture 101 containing only one photo-sensitive site 102, but four possible sampling and storage sites 103A-103D. The letters A, B, C, D illustrate four outputs of the photo-sensitive area 102 or four drifting directions of the four samplings inside the photo-sensitive area 102. Each of the storage sites 103A-103D is unambiguously associated to a corresponding output A-D, respectively, of the photo-sensitive area 102. In other words: charge carriers that drift to corner A of the photo-sensitive area 102 are stored in the corresponding storage site 103A, etc. It can be seen that the photo-sensitive area 102 has to be small in both geometrical dimensions in order to deliver short transfer paths and, thus, high-speed demodulation operation. Therefore, this architecture yields low sensitivity.

For any kind of optical-demodulation pixels, there has always been a trade-off between optical sensitivity of the pixel and high-speed demodulation operation. The optical sensitivity of the pixel is mainly given by the optical fill factor, i.e., the ratio of photo-sensitive area of a pixel to its total area. The readout electronics is usually covered by a light shield; therefore it increases the total pixel area and decreases the fill factor of the pixel. Hence, in order to achieve optically highly sensitive pixels, the photo-sensitive area had to be scaled up. By contrast, in order to perform high-speed sampling on the pixel level, the paths of the photo-generated charge carriers to the storage capacitance have to be short and thus, the photo-sensitive size has to be small. Unlike the pixels 101 of FIGS. 1-3 and all other existing demodulation pixels, the pixel according to the present invention exhibits a high optical sensitivity and a high demodulation speed.

Figure 4:
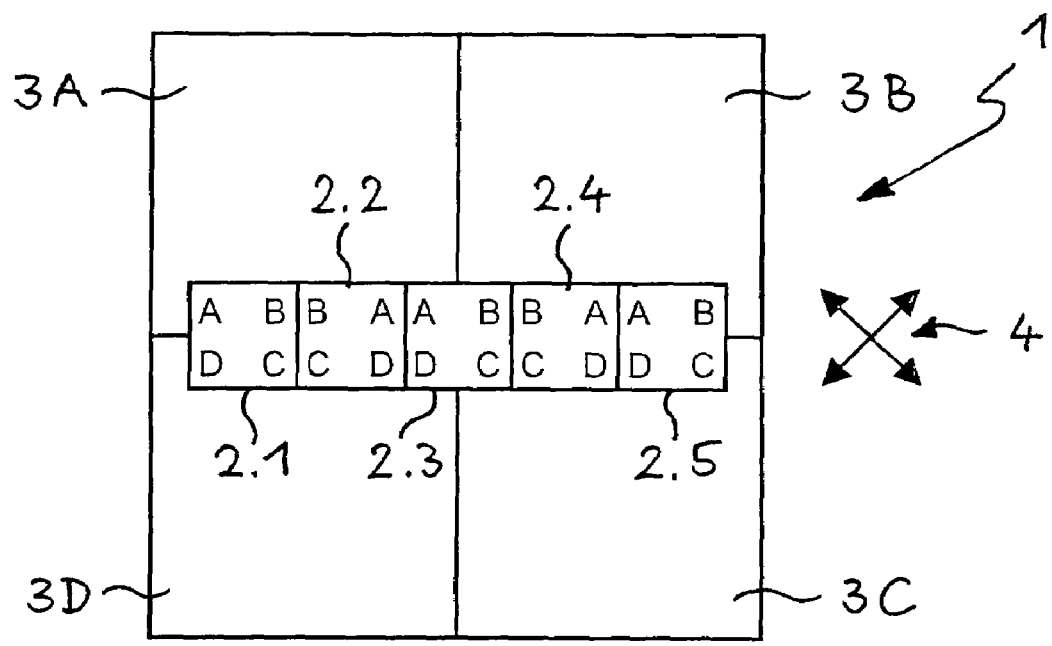
FIGS. 4-7 show four embodiments of the pixel according to the invention, in top views.
Figure 5:
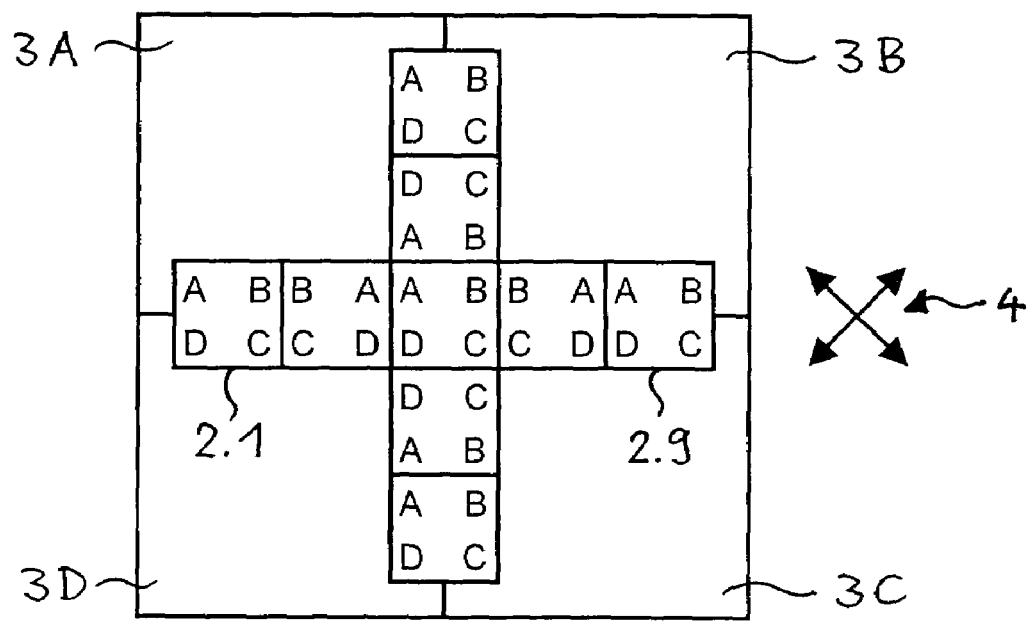
Figure 6:
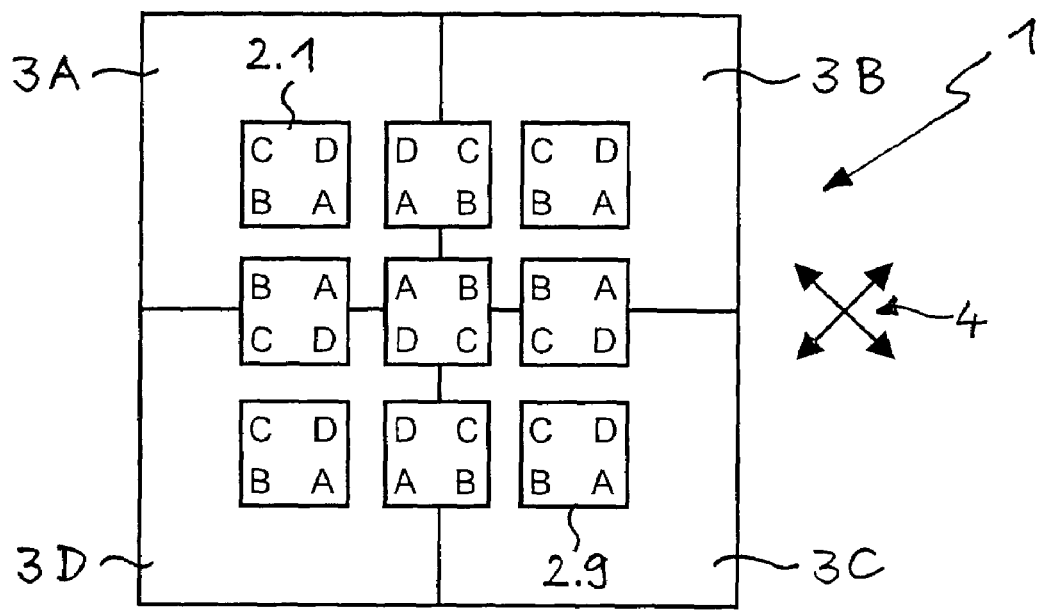

Three preferred semiconductor implementations of the pixel 1 according to the invention with a plurality of small-sized photo-sensitive areas 2.1, 2.2, ..., each photo-sensitive area 2.1, 2.2, ... having four outputs A-D, and with four storage sites 3A-3D are presented in FIGS. 4-6. The limited number of storage sites 3A-3D should not restrict the invention in any way. Generally, an arbitrary number of storage sites is possible.

Figures 8A, 8B:
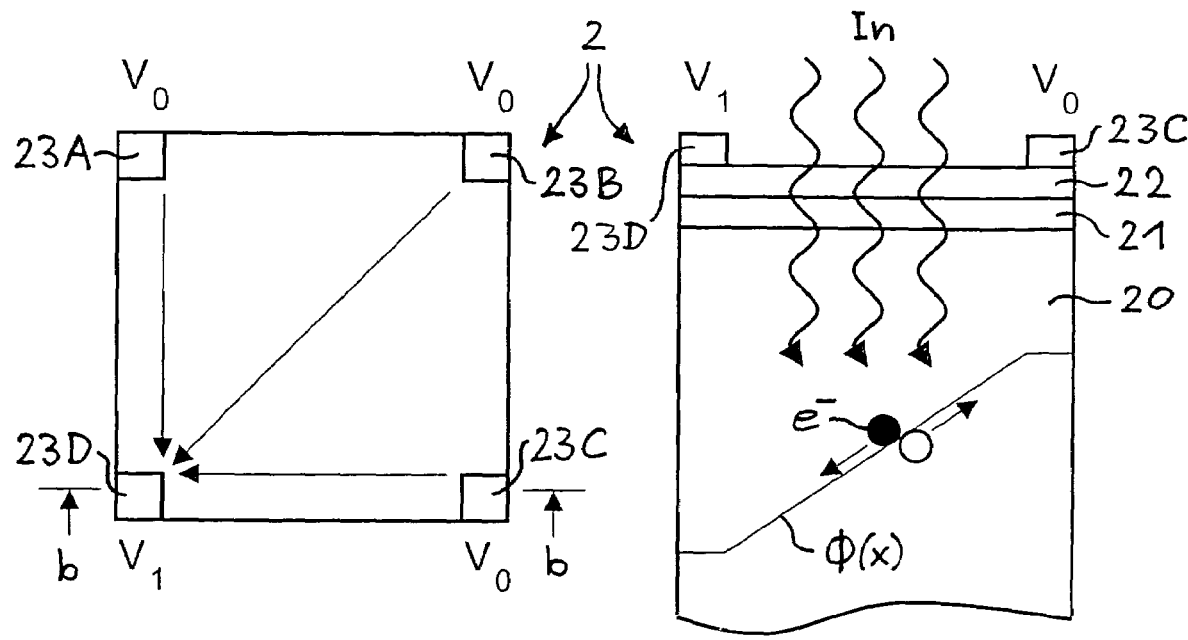
FIG. 8 shows transfer means for the pixel according to the invention based on a high-resistive gate, (a) in a top view and (b) in a cross-section along line b-b.

The pixel 1 according to the invention comprises at least two small-sized photo-sensitive areas 2.1, 2.2, .... The pixel 1 further comprises at least two, and preferably four, storage sites 3A-3D. Each photo-sensitive area 2.1, 2.2, . . . can be connected to any of the storage sites 3A-3D. The pixel 1 comprises transfer means for transferring the photo-generated charges from the photo-sensitive areas 2.1, 2.2, . . . to any selected one of the storage sites 3A-3D, e.g., to a fourth storage site 3D. Such transfer means are illustrated in FIGS. 8 and. 9. The transfer means of each pixel 1 are preferably controlled globally, i.e., from outside the pixel 1. The output of the transfer means within a pixel 1 leads to a selectable in-pixel storage site 3A-3D. All samplings of the photo-sensitive areas 2.1-2.5 of a pixel 1 are cumulated via the transfer means in the selected storage site, e.g., 3D. The possible charge-transfer directions are sketched by two double arrows 4. It also possible to transfer the charges in vertical and horizontal directions (not shown here). The present invention is not limited by the charge-transferring direction discussed with reference to the attached drawings.

Appropriate transport means (not shown) such as electric lines or fields may be provided for transporting the electric signals from the photo-sensitive areas 2.1, 2.2, . . . to the storage sites 3A-3D. In contrast to the prior-art pixels 101 of FIGS. 1-3, the outputs A-D of the photo-sensitive areas 2.1, 2.2, . . . are not necessarily in geometric neighborhood of the storage sites 3A-3D. The outputs A-D of two neighboring photo-sensitive areas 2.1, 2.2 are preferably oriented such that two outputs B, B leading to the same storage site 3B are close to each other. Two such outputs B, B may even be electrically contacted to each other and use the same line for transporting the electric signals to the corresponding storage site 3B. The photo-generated charge carriers stored in the different storage sites 3A-3D of a pixel 1 can be processed further on the pixel level, e.g., by subtraction and phase calculation, or can be read out with conventional active-pixel-sensor (APS) readout techniques and processed further outside the pixel 1. Means and methods for reading out electric signals stored in storage sites 3A-3D of a pixel 1 are known from the prior art.

A first embodiment of a pixel 1 according to the invention is depicted in FIG. 4. Five small-sized photo-sensitive areas 2.1-2.5 of rectangular or square shape are placed in a row. They are all interlinked to the four storage sites 3A-3D by appropriate transfer means for transferring the charge carriers to a common storage site, e.g., 3D. The storages sites 3A-3D and the output electronics are shared by all five small-sized photo-sensitive areas 2.1-2.5 of the pixel 1. Already here, an increase of both fill-factor and demodulation frequency is recognized when comparing the pixel arrangement with the prior-art pixel architecture of FIG. 3.

FIG. 5 illustrates a second embodiment of the pixel 1 according to the invention. Several, e.g., nine, small-sized photo-sensitive areas 2.1-2.9 form a cross-like area on the pixel 1. The number of storage sites 3A-3D is four again.

FIG. 6 shows a pixel 1 with a two-dimensional array of, e.g., 3×3=9 small-sized photo-sensitive areas 2.1-2.9, delivering four samples each to a selected one, e.g., 3D, of four storage areas 3A-3D.

Figure 7:
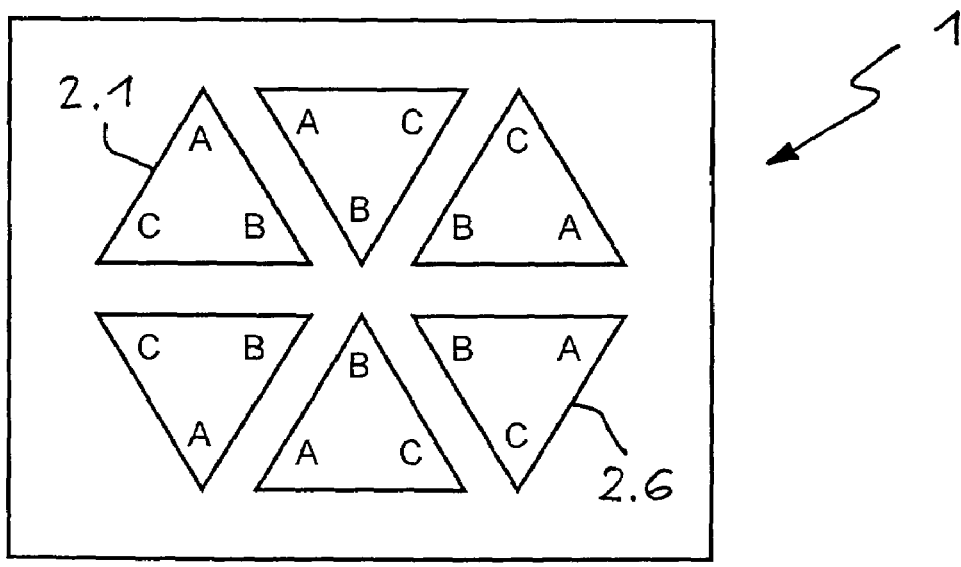

It is possible to design pixels 1 according to the invention with a plurality of photo-sensitive areas 2.1-2.6 delivering three samples. Such an embodiment is sketched in FIG. 7, where six small-sized photo-sensitive elements 2.1-2.6 transfer their charge carriers to a selected one of three common storage sites (not shown).

Figure 9:
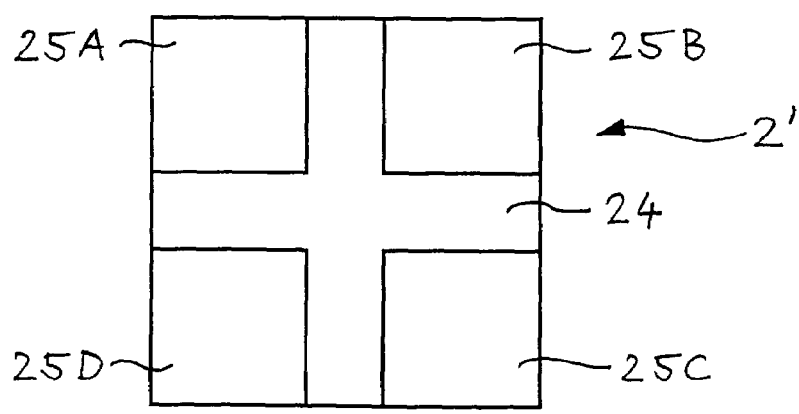
FIG. 9 shows transfer means for the pixel according to the invention based on charge-coupled devices, in a top view.

Preferred photo-sensitive elements 2, 2' that allow controlling the transfer of photo-generated electrons to different storage sites are depicted in FIGS. 8 and 9, respectively. The invention is, however, not limited to these two presented demodulation structures, but brings an enhancement in any imaginable pixels using demodulation structures.

A first photo-sensitive element 2, shown in FIG. 8, is based on a highly resistive photo-gate structure 22. The sheet resistance of the resistive layer 22 is higher than 10 $\Omega/\square$, and preferably more than 10 k$\Omega/\square$, e.g., many tens of k$\Omega/\square$, and up to about 1 M$\Omega/\square$. The photo-gate structure 22 and the substrate 20 are separated from each other by an insulating layer 21 which is formed in most semiconductor processes by silicon-oxide material. Electric connections 23A-23D are provided, preferably in the corners of the square photo-gate 22, for applying voltages or currents to the photo-gate 22. In the example of FIG. 8, equal potentials $V_0$ are applied to three connections 23A-23C, whereas a higher potential $V_1 > V_0$ is applied to the fourth connection 23D. A current flow through the transparent photo-gate 22 generates a strong electric field in a region of a substrate 20 below the photo-gate 22. A proper potential distribution $\Phi(x)$ enforces electrons $e^-$ generated in the substrate by incident radiation In to drift towards connection 23D and to only one of a plurality of storage nodes (not shown) beside the photo-gate structure 22. The storage nodes can be designed as diffusion wells or integration gates. Each storage node is allocated to and electrically connected with a corresponding storage site 3A-3D (cf. FIG. 4). Thus, the structure shown in FIG. 8 acts as transfer means for transferring the charge carriers photo-generated in the photo-sensitive element 2 to one of the storage sites 3A-3D.

The second preferred photo-sensitive element 2', shown in FIG. 9, is based on charge-coupled devices (CCDs), i.e., overlapping gate structures. The photo-sensitive element 2' is designed to have a square shape. Four CCD gate electrodes 25A-25D are arranged in the corners of the square. The remaining, cross-shaped area is a static gate 24. There is no static current flowing through the gate structures. By properly biasing the CCD gate electrodes 25A-25D, the capacitive coupling between the gates 25A-25D and 24 generates a potential distribution that enables the flow of photo-generated charge carriers to a selected one of the storage sites 3A-3D (cf. FIG. 4).

This invention is not limited to the preferred embodiments described above, to which variations and improvements may be made, without departing from the scope of protection of the present patent.

LIST OF REFERENCE SIGNS

1 Pixel
2 Radiation-sensitive element
20 Substrate
21 Insulating layer
22 Photo-gate
23 Electric connections
24 Resistive gate
25 CCD gate electrode
3 Storage element
A-D Outputs of radiation-sensitive elements

The invention claimed is:
1. A pixel for use in an image sensor, comprising
a plurality of storage elements for storing charge carriers, each of the storage elements comprising a diffusion well or an integration gate for accumulating the charge carriers, and
a plurality of radiation-sensitive elements for converting incident radiation into the charge carriers, wherein each of the radiation sensitive elements includes: outputs, each of the outputs being electrically connected a different one of the storage elements, and a charge transport system for transporting the charge carriers to a selected one of the outputs with the charge carriers being summed up in each of the storage elements from the plurality of radiation-sensitive elements.

2. An image sensor comprising a plurality of pixels arranged in a one- or two-dimensional array, characterized in that the pixels are pixels according to claim 1.

3. The pixel according to claim 1, wherein the charge transport system comprises at least two CCD gate electrodes, each CCD gate electrode having a connection for applying an electric potential across the radiation-sensitive element.

* * * * *